United States Patent
Haley et al.

[11] Patent Number: 5,953,200
[45] Date of Patent: Sep. 14, 1999

[54] MULTIPLE POLE ELECTROSTATIC CHUCK WITH SELF HEALING MECHANISM FOR WAFER CLAMPING

[75] Inventors: Mark W. Haley, Rio Medina; Albert H. Liu, San Antonio, both of Tex.

[73] Assignee: VLSI Technology, Inc., San Jose, Calif.

[21] Appl. No.: 09/019,458

[22] Filed: Feb. 5, 1998

[51] Int. Cl.$^6$ ................................................ H02N 13/00
[52] U.S. Cl. ................................. 361/234; 279/128
[58] Field of Search .................................. 361/233, 234, 361/235, 104; 279/128; 324/550, 551; 269/8

[56] References Cited

U.S. PATENT DOCUMENTS

| | | | |
|---|---|---|---|
| 5,413,360 | 5/1995 | Atari et al. ........................... | 279/128 |
| 5,691,876 | 11/1997 | Chen et al. ........................... | 361/234 |
| 5,737,178 | 4/1998 | Herchen ............................. | 361/234 |
| 5,751,537 | 5/1998 | Kumar et al. ...................... | 361/234 |
| 5,835,335 | 11/1998 | Ross et al. ......................... | 361/234 |

OTHER PUBLICATIONS

John Field, "Wafer Temperature Control: Advanced Solutions for Next Generation Manufacturing", Oct. 14, 1997, Lam Research Corp., Fremont, Ca.

Primary Examiner—Jeffrey Gaffin
Assistant Examiner—Kim Huynh
Attorney, Agent, or Firm—Martine Penilla & Kim, LLP

[57] ABSTRACT

An electrostatic chuck device for clamping a semiconductor wafer substrate during processing of the semiconductor wafer includes a power source, at least one negative pole, and a plurality of positive poles. Each positive pole selected from the plurality of positive poles is electrically separated from the negative pole. Also provided is a plurality of fuses, each fuse of the plurality of fuses is coupled to an associated positive pole included in the plurality of positive poles. Each fuse is further coupled to the power source. In some embodiments, each positive pole is electrically separated from the negative pole by an insulating epoxy. In other embodiments, the plurality of positive poles are connected to each other in parallel.

9 Claims, 4 Drawing Sheets

MULTIPLE POLE ELECTROSTATIC CHUCK WITH SELF HEALING MECHANISM FOR WAFER CLAMPING

BACKGROUND OF THE INVENTION

1. Field of Invention

The present invention relates generally to methods and apparatus for use in semiconductor fabrication. More particularly, the present invention relates to methods and apparatus for using a multiple pole configuration in an electrostatic chuck arranged to support a semiconductor wafer during semiconductor fabrication.

2. Description of the Prior Art

In the manufacture of semiconductor devices, the reliability and the repeatability of fabrication processes is crucial. That is, consistency in semiconductor fabrication is important to ensure that the final semiconductor product is robust and functions as intended. The overall fabrication of semiconductor devices generally includes processes such as etching, polishing, and deposition. As will be appreciated by those skilled in the art, etching processes, polishing processes, and deposition processes typically require that a semiconductor wafer is securely held, e.g., clamped.

In general, mechanical devices may be used to clamp a wafer during processing. FIG. 1 is a diagrammatic cross-sectional representation of a conventional mechanical device used to clamp a semiconductor wafer during processing. A mechanical device 10 includes a base plate 14 and top plates 18. A semiconductor wafer 22 is held between base plate 14 and top plates 18. Specifically, wafer 22 is held such that a top surface 24 of wafer 22 contacts top plates 18, while a bottom surface 26 of wafer 22 rests against base plate 14.

The use of mechanical device 10 may cause inconsistencies in the overall processing of wafer 22. By way of example, during an etching process used to etch top surface 24, the portions of top surface 24 which contact top plates 18 may not be properly etched, as top plates 18 generally obscure at least a portion of top surface 24. In other words, the edges of top surface 24 which are in contact with top plates 18 may not be uniformly etched, thereby affecting the overall fabrication of semiconductors contained within wafer 22.

In order to eliminate contact between the top surface of a wafer and a clamping mechanism such as a top plate, electrostatic clamps, or chucks, are often used to secure a wafer that is being processed. An electrostatic chuck is generally arranged to use the force of attraction between a positive charge and a negative charge to produce a force that is sufficient to hold a wafer in place. In other words, an electrostatic chuck uses forces created between a positive charge and a negative charge to essentially clamp a wafer.

FIG. 2 is a diagrammatic representation of a bipolar electrostatic chuck device in accordance with prior art. A bipolar electrostatic chuck device 50 includes a base plate 54 and a positive electrode 58. As will be appreciated by those skilled in the art, base plate 54 typically holds a negative charge, while positive electrode 58 holds a positive charge. Base plate 54 and positive electrode 58 are generally separated by a first insulator 60. A second insulator 62 is arranged over base plate 54 and positive electrode 58 in order to insulate a semiconductor wafer 64 from electric charges associated with base plate 54 and positive electrode 58. Wafer 64 is held against second insulator 62 when an attraction between positive electrode 58 and base plate 54 causes an electrostatic attraction between wafer 64 and positive electrode 58.

A power source 66 is arranged to apply voltage to base plate 54 and to positive electrode 58. No voltage is applied directly to wafer 64. Instead, as previously mentioned, the attraction between positive electrode 58 and base plate 54 causes wafer 64 to be attracted to positive electrode 58. Hence, wafer 64 may be secured against second insulator 62.

First insulator 60 is typically composed of a material with a high dielectric constant, such as an insulating epoxy. Second insulator 62 is also typically composed from a material with a high dielectric constant, e.g., silicon dioxide or titanium dioxide. As will be appreciated by those skilled in the art, if either first insulator 60 or second insulator 62 and "breaks down," bipolar electrostatic chuck device 50 will fail, and wafer 64 will no longer be securely held. By way of example, when first insulator 60 breaks down, or degrades, positive electrode 58 will typically short against base plate 54, thereby causing a failure of bipolar electrostatic chuck device 50. Degradation of first insulator 60 may occur for any number of different reasons, including, but not limited to, extended exposure to chemicals such as chlorine and sulfur tetraflouride. Chlorine and sulfur tetraflouride are often present in plasmas used during semiconductor fabrication processes.

The failure of an electrostatic chuck device may cause significant problems. For example, when an electrostatic chuck device fails, the device must generally either be repaired or replaced, thereby causing downtime in the overall semiconductor fabrication process. Further, any semiconductor wafer which is mounted on an electrostatic chuck device at the time of failure may be damaged. Downtime in the overall semiconductor fabrication process is undesirable in that it affects the efficiency of the fabrication process, whereas damage to a semiconductor wafer may cause reliability issues in semiconductor devices formed from the wafer. Therefore, what is needed is an improved electrostatic chuck device that is less likely to fail catastrophically.

DISCLOSURE OF THE INVENTION

An electrostatic chuck device for clamping a semiconductor wafer substrate during processing of the semiconductor wafer substrate in accordance with an aspect of the present invention includes: (a) a power source; (b) at least one negative pole; (c) a plurality of positive poles, wherein each positive pole selected from the plurality of positive poles is electrically separated from the negative pole; and (d) a plurality of fuses, each fuse of the plurality of fuses being coupled to an associated positive pole included in the plurality of positive poles, wherein each fuse is further coupled to the power source. In some embodiments, each positive pole is electrically separated from the negative pole by an insulating epoxy. In other embodiments, the plurality of positive poles are connected to each other in parallel.

In accordance with another aspect of the present invention, a method for forming an electrostatic chuck device for use in securing a semiconductor wafer substrate includes providing a power source and providing a base plate which holds a negative charge and is arranged to support the semiconductor wafer substrate. The base plate is coupled to the power source, and a first positive pole that is arranged to hold a positive charge is provided, along with a first fuse. The first fuse is coupled to the first positive pole such that the first fuse is arranged to deactivate the first positive pole when the first positive pole is no longer isolated from the base plate. The first fuse is also coupled to the power source, wherein the first positive pole and the base plate are arranged to create a first attraction force that is arranged to secure the semiconductor wafer substrate. In one embodiment, the method includes providing a second positive pole, coupling the second positive pole to the power source, providing a second fuse, and coupling the second fuse to the second positive pole.

The present invention provides an improved electrostatic chuck apparatus for clamping a semiconductor wafer substrate during wafer fabrication that includes multiple poles arranged in a grid configuration. By providing multiple poles and, further, by coupling the multiple poles to fuses, when an insulating layer which insulates positive charges from negative charges degrades, the redundancy afforded by the multiple poles generally renders the electrostatic chuck less as likely to suffer a catastrophic failure. If the insulating layer near one pole degrades, the fuse associated with that pole blows, and effectively "removes" that pole from the grid configuration, thereby allowing the remainder of the poles to continue functioning. Hence, rather than causing the entire electrostatic chuck to fail catastrophically, a degradation in the insulating layer generally does not significantly affect the overall electrostatic chuck.

These and other advantages of the present invention will become apparent upon reading the following detailed descriptions and studying the various figures of the drawings

BRIEF DESCRIPTION OF THE DRAWINGS

The invention, together with further advantages thereof, may best be understood by reference to the following description taken in conjunction with the accompanying drawings in which.

BEST MODES FOR CARRYING OUT THE INVENTION

As noted previously, electrostatic clamps, or chucks, are often used to secure a wafer that is being processed. The use of electrostatic chucks, which use the force of attraction between a positive electrode and a negative electrode to produce a force that is sufficient to hold a wafer in place, eliminates physical contact between the top surface of the wafer and a clamping mechanism. If an insulator between the positive electrode and the negative electrode of an electrostatic chuck degrades, the positive electrode will generally short against the negative electrode, thereby causing a failure of the electrostatic chuck. By implementing multiple electrodes within an electrostatic chuck in a configuration that enables a wafer to remain clamped even with some degradation in an insulator, the potential for a catastrophic failure of the electrostatic chuck may be reduced.

Figure 1:
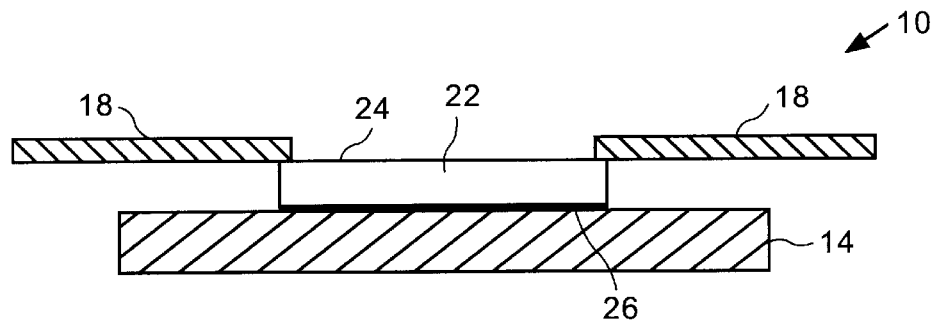
FIG. 1 is a diagrammatic cross-sectional representation of a conventional mechanical semiconductor wafer clamping device.
Figure 2:
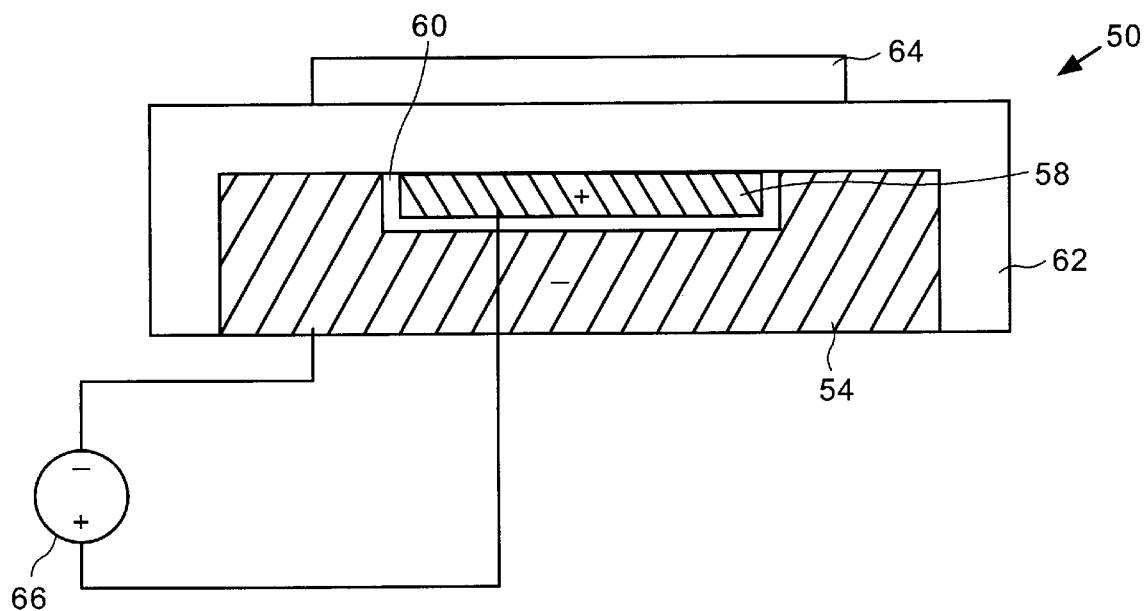
FIG. 2 is a diagrammatic cross-sectional representation of a conventional bipolar electrostatic chuck device.
Figure 3:
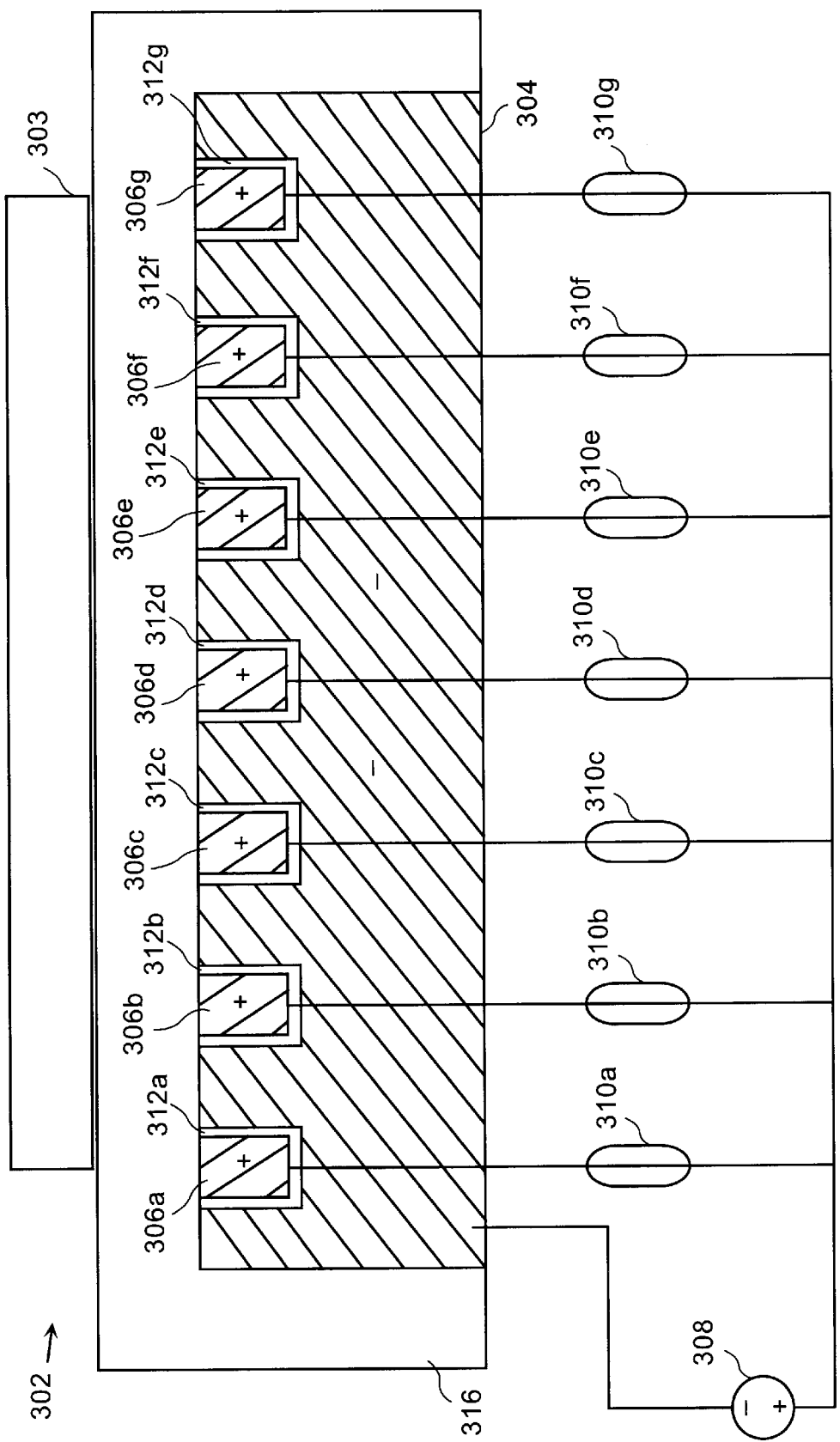
FIG. 3 is a diagrammatic cross-sectional representation of a multiple pole electrostatic chuck device in accordance with a first embodiment of the present invention.

With reference to FIG. 3, a multiple pole electrostatic chuck device will be described in accordance with a first embodiment of the present invention. A multiple pole electrostatic chuck device 302 is arranged to support a semiconductor wafer substrate 303 includes a base plate 304, which holds a negative charge, and a plurality of positive poles 306a–g. The number of positive poles 306a–g included in electrostatic chuck device 302 may generally be widely varied, and is dependent upon factors such as the size of wafer substrate 303. By way of example, for a wafer substrate with a diameter of approximately six inches, the use of approximately fifty positive poles may be preferred. Alternatively, for a wafer substrate with a diameter of approximately twelve inches, the use of approximately one hundred positive poles may be preferred.

Positive poles 306a–g are each separated from base plate 304 by pole insulators 312a–g, respectively. Pole insulators 312a–g are arranged to prevent positive poles 306a–g from shorting out against base plate 304. While pole insulators 312a–g may generally be formed from any suitable material, in one embodiment, pole insulators 312a–g are often made from an epoxy material with dielectric properties. Alternatively, in other embodiments, pole insulators 312a–g may be formed from an anodized material or a ceramic film.

In general, pole insulators 312a–g may have substantially any suitable thickness. In other words, the separation between each positive pole 306a–g and base plate 304 may be widely varied. For instance, a pole insulator such as pole insulator 312a may have a thickness in the range of approximately one mil (i.e., 0.001 inches) to approximately five mils, as for example approximately three mils.

An overlying insulator 316 is arranged over base plate 304 and positive poles 306a–g to insulate wafer substrate 303 from electric charges associated with both base plate 304 and positive poles 306a–g. Like pole insulators 312a–g, overlying insulator 316 may be formed from substantially any suitable material with dielectric properties including, for example, epoxy, anodized materials, and ceramic. Overlying insulator 316, however, is generally thicker than pole insulators 312a–g. Specifically, overlying insulator 316 typically has a thickness in the range of approximately 2 mils to approximately 6 mils, although it should be appreciated that the thickness of overlying insulator 316 may vary.

A power source 308 is arranged to supply voltage to both base plate 304 and positive poles 306a–g. As shown, power source 308 is coupled to positive poles 306a–g through fuses 310a–g, respectively. In the described embodiment, positive poles 306a–g, are arranged in a grid, e.g., an electrostatic grid. That is, positive poles 306a–g are arranged in parallel. Fuses 310a–g are arranged to ensure that the shorting of any positive poles 306a–g associated with a given fuse 310a–g, respectively, against base plate 304, due to degradation of the associated pole insulator 312a–g, does not result in a catastrophic failure of electrostatic chuck device 302. By way of example, if positive pole 306a shorts out against base plate 304 due to degradation of pole insulator 312a, fuse 310a will "blow," and allow remaining positive poles 306b–g to function, as will be described below with respect to FIG. 4. When positive pole 306a fails, positive poles 306b–g may continue functioning, since positive poles 306b–g are arranged in parallel with positive pole 306a. In other words, fuses 310a–g essentially serve as a self-healing mechanism which allows one positive pole 306a–g to be disabled, without disabling electrostatic chuck device 302 as a whole.

In general, a fuse is rated for a maximum, or threshold, current level, and is arranged to blow when a metallic link within the fuse melts. The metallic link in the fuse melts when a current that exceeds the maximum current rating passes through the fuse. Fuses 310a–g may be of substantially any type. Suitable fuses include, but are not limited to, any semiconductor or ferrule fuse, or other types of fuses rated for about 1/10 Amps at 600 V or more.

Figure 4:
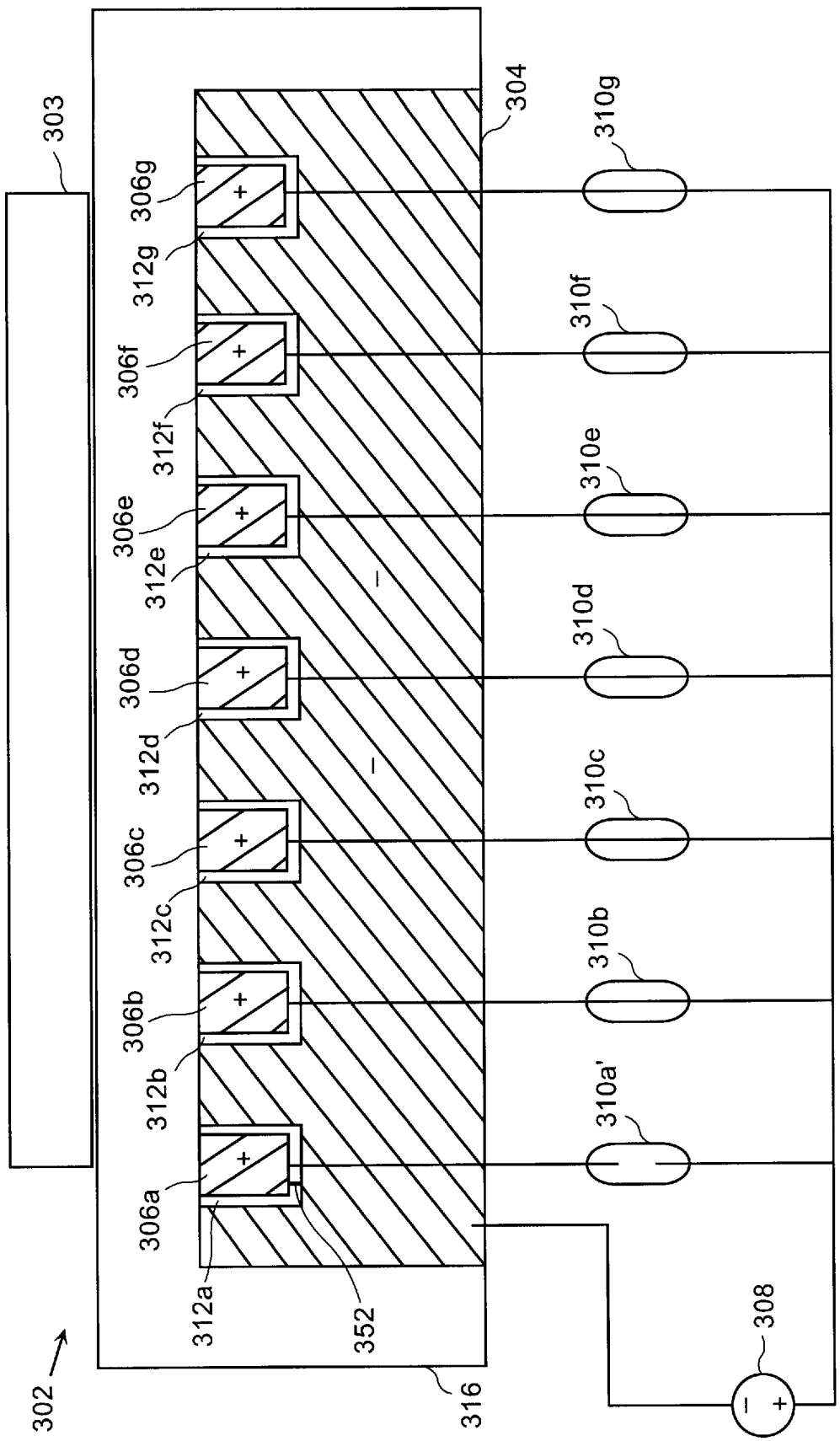
FIG. 4 is a diagrammatic cross-sectional representation of the multiple pole electrostatic chuck device of FIG. 3 after a fuse has been blown in accordance with the first embodiment of the present invention.

FIG. 4 is a representation of multiple pole electrostatic chuck device 302 of FIG. 3 after a fuse has been blown in accordance with the first embodiment of the present invention. As shown, fuse 310a' is blown. In the described embodiment, fuse 310a' is blown when positive pole 306a shorts against base plate 304, which holds a negative charge. A short 352, or short circuit, is often the result of a degradation of pole insulator 312a. Short 352, as will be appreciated by those skilled in the art, causes excessive current to flow from power source 308 to positive pole 312a. Fuse 310a' is blown when short 352 causes current that exceeds the maximum current rating of fuse 310a' to flow through fuse 310a'.

When fuse 310a' is blown, positive pole 312a becomes essentially useless in terms of creating an electrostatic attraction to secure wafer substrate 303. However, redundancy is created in electrostatic chuck device 302 by positive poles 312b–g, as even without positive pole 312a, positive poles 312b–g still serve to secure wafer substrate 303. Therefore, the redundancy created by the use of multiple positive poles 312a–g functioning in parallel prevents short 402 from causing a catastrophic failure of electrostatic chuck device 302.

In general, in a grid arrangement of positive poles 312a–g as shown, multiple positive poles 312a–g may be "inactivated," or otherwise rendered unusable due to shorts, before electrostatic chuck device 302 is considered to fail overall. That is, wafer substrate 303 may generally be secured by electrostatic chuck device 302 until a "threshold" number of positive poles 312a–g fails. The minimum number of positive poles 312a–g needed to secure wafer substrate 303 against electrostatic chuck device 302 may be widely varied, and is dependent on a variety of different factors. The factors may include, but are not limited to, the spacing between adjacent positive poles 312a–g, the relative strength of the attraction force associated with each positive pole 312a–g, and the size of wafer substrate 303. In one embodiment, for a wafer substrate with approximately a six inch diameter, if approximately fifty positive poles are included in an electrostatic chuck device that holds the wafer substrate, the failure of more than approximately twenty-five positive poles may cause the electrostatic chuck device to be unable to secure the wafer substrate. In other words, the wafer substrate may be secured using only approximately twenty-five of fifty total positive poles.

The number of positive poles 312a–g needed to secure wafer substrate 303 may also be dependent upon the location of "functioning" positive poles. By way of example, in one embodiment, four positive poles may fail. If four positive poles were to fail, the force which with wafer substrate 303 is held against electrostatic chuck device 302 is likely stronger if positive poles 312a, 312c, 312e, and 312g were to fail, rather than if positive poles 312a–d were to fail. In other words, the distribution of the attraction force may affect the number of positive poles 312a–g considered to be necessary to securely hold wafer substrate 303 against electrostatic chuck device 302.

Figure 5:
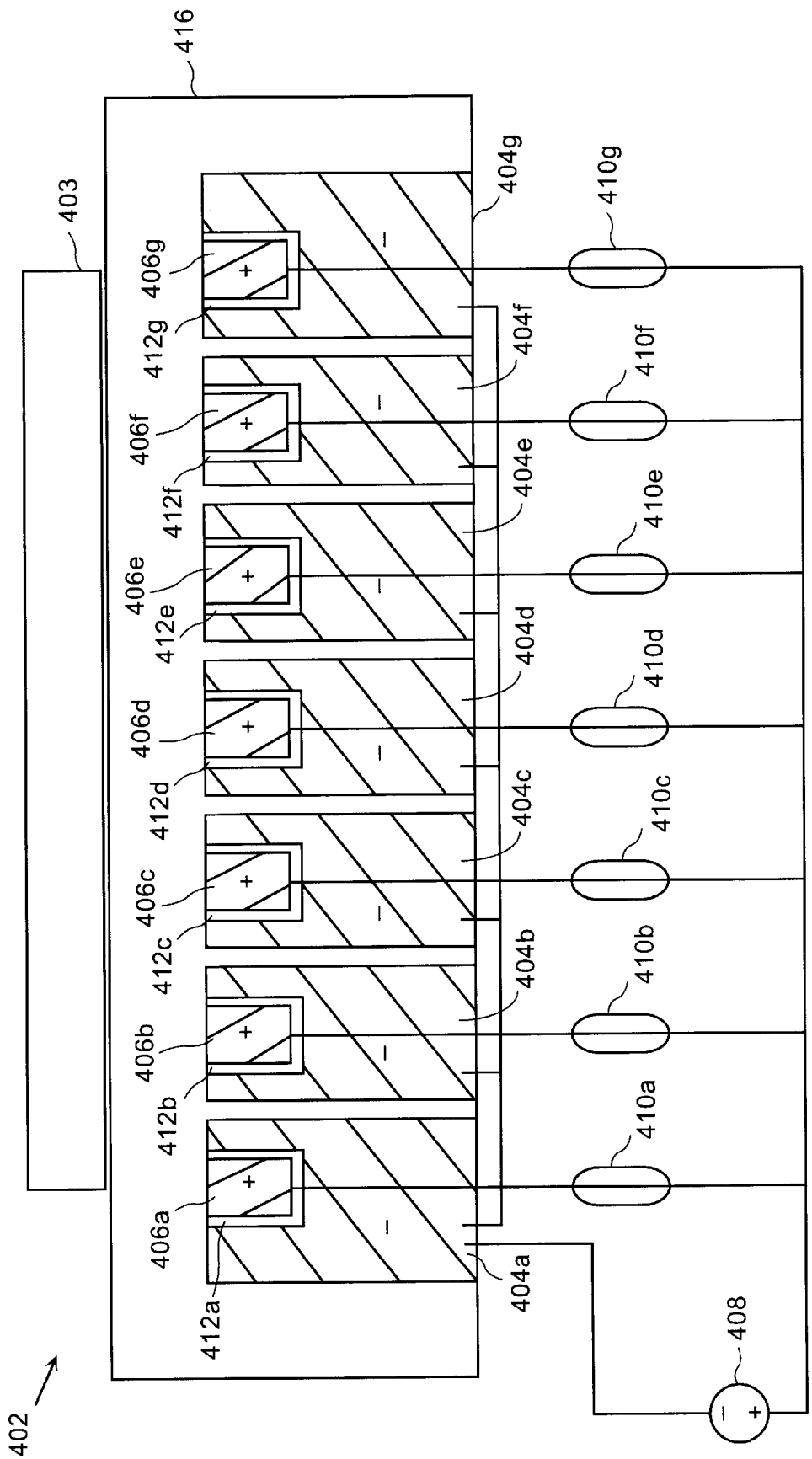
FIG. 5 is a diagrammatic cross-sectional representation of a multiple pole electrostatic chuck device in accordance with a second embodiment of the present invention.

FIG. 5 is a representation of a multiple pole electrostatic chuck device in accordance with a second embodiment of the present invention. An electrostatic chuck device 402 which is arranged to support a semiconductor wafer substrate 403 includes a plurality of positive poles 406a–g. Electrostatic chuck device 502 also includes a plurality of negative poles 404a–g, each of which is associated with a respective positive pole 406a–g. In one embodiment, negative poles 404a–g essentially form a base plate for electrostatic chuck device 402.

Positive poles 406a–g are separated from negative poles 404a–g, respectively, by pole insulators 412a–g. For example, positive pole 406a is separated from negative pole 404a by pole insulator 412a. Pole insulators 412a–g are generally arranged to prevent positive poles 406a–g from shorting out against negative poles 404a–g. While pole insulators 412a–g may be formed from any suitable material, pole insulators 412a–g are often made from an epoxy material which has dielectric properties. Alternatively, pole insulators 412a–g may be formed from an anodized material or a ceramic film.

An overlying insulator 416 is arranged over negative poles 404a–g and positive poles 406a–g to insulate wafer substrate 403 from electric charges. Like pole insulators 412a–g, overlying insulator 416 may be formed from substantially any suitable material with dielectric properties including, for example, epoxy, anodized materials, and ceramic. As shown, overlying insulator 416 also serves to separate adjacent negative poles 404a–6.

A power source 408 is arranged to supply voltage to both negative poles 404a–g and positive poles 406a–g. Power source 408 is coupled to positive poles 406a–g through fuses 410a–g, respectively. Fuses 410a–g are arranged to ensure that the shorting of any positive poles 406a–g against associated negative poles 404a–g does not result in a catastrophic failure of electrostatic chuck device 402, as described above with respect to FIG. 3.

Although only a few embodiments of the present invention have been described, it should be understood that the present invention may be embodied in many other specific forms without departing from the spirit or the scope of the present invention. By way of example, the spacing between adjacent positive poles in a grid arrangement within an electrostatic chuck may vary. That is, while the spacing between adjacent positive poles may be substantially uniform throughout the electrostatic chuck, the spacing may also be vary between different adjacent positive poles. The different spacing may be desirable if a larger concentration of positive poles is needed in a specific area, while fewer positive poles are needed in other areas.

As previously described, each positive pole in an electrostatic chuck is coupled to a fuse. However, it should be appreciated that in some embodiments, such as embodiments which include a relatively large amount of positive poles, a plurality of positive poles may be coupled to a single fuse. In other words, at least some fuses may be shared by more than one positive pole. By allowing a plurality of positive poles to share a single fuse, the number of fuses needed in an electrostatic chuck may be reduced, without greatly compromising the reliability of the electrostatic chuck. For example, if an electrostatic chuck includes approximately fifty positive poles, twenty-five fuses may be used such that every two positive poles is coupled to a single fuse without departing from the spirit or the scope of the present invention.

Alternatively, it should be appreciated that in some embodiments, an electrostatic chuck may include both positive poles which are coupled to fuses as well as positive poles which are not coupled to fuses. That is, only some of the positive poles included in an electrostatic chuck may be coupled to fuses. By way of example, if certain poles within an electrostatic chuck are observed to be less likely to fail, due to degradation in their associated pole insulators, fuses may not necessarily be coupled to those poles.

While the use of fuses has been described above as being suitable for implementation in an electrostatic chuck in accordance with the present invention, substantially any device which is arranged to stop the flow of current to a positive pole that is shorted out may be used in lieu of fuses. Such alternate devices may include, but are not limited to, a crowbar circuit which has a self clamping design.

The thickness of pole insulators and an overlying insulator in an electrostatic chuck device may generally be widely varied. Further, the thickness of each pole insulator included in an electrostatic chuck may vary across the electrostatic chuck, i.e., the thickness of the pole insulator around one positive pole may differ from the thickness of the pole insulator around another positive pole. In one embodiment, the thickness of a single pole insulator may also be non-uniform. Still further, the polarity of the base plate and poles may be switched, depending on the arrangement of the power source, and therefore, it is not a requirement that the base plate be negative and the poles be positive.

Therefore, the present examples are to be considered as illustrative and not restrictive, and the invention is not to be limited to the details given herein, but may be modified within the scope of the appended claims along with their full scope of equivalents.

What is claimed is:

1. An electrostatic chuck device arranged to hold a semiconductor wafer substrate during processing of the semiconductor wafer substrate, the device comprising:
    a power source;
    a plurality of negative poles, each of the negative poles having a chuck surface and a recess formed through the chuck surface;
    a plurality of positive poles, wherein each positive pole selected from the plurality of positive poles is received in one of the recesses of a corresponding one of the negative poles, each of the positive poles being electrically separated from the corresponding negative pole; and
    a plurality of fuses, each fuse of the plurality of fuses being coupled to an associated positive pole included in the plurality of positive poles, wherein each fuse is further coupled to the power source.

2. An electrostatic chuck device as recited in claim 1 wherein each of the positive poles selected from the plurality of positive poles and the corresponding negative pole are electrically separated by an insulating epoxy, and each positive pole and corresponding negative pole form a separate chuck unit electrically and physically separate from an adjacent separate chuck unit.

3. An electrostatic chuck device as recited in claim 1 further including a dielectric surface, the dielectric surface being arranged to contact the semiconductor wafer substrate and to prevent the semiconductor wafer substrate from directly contacting the plurality of negative poles and the plurality of positive poles.

4. An electrostatic chuck device as recited in claim 3, the device further comprising:
    the plurality of negative poles being spaced to define separate chuck units; and
    the dielectric surface extending between the separate chuck units.

5. A chuck device arranged to clamp a semiconductor wafer substrate during processing of the semiconductor wafer substrate, the device comprising:
    a base plate, the base plate being divided into separate units, each of the units having a chuck surface and a recess extending from the chuck surface into the base plate, each of the base plate units being arranged to hold a negative charge, wherein the base plate is arranged to support the semiconductor wafer substrate;
    a plurality of positive poles, each of the positive poles being received in a respective one of the recesses and being arranged to hold a positive charge, wherein each of the positive poles in a respective recess and the respective unit of the base plate are arranged to create a separate attraction force; and
    a plurality of fuses, one of the plurality of fuses being coupled to a respective one of the positive poles, wherein each of the fuses is arranged to deactivate the respective positive pole when the respective positive pole comes into contact with the base plate.

6. A chuck device as recited in claim 5 wherein each of the positive poles selected from the plurality of positive poles is separated from the respective unit of the base plate by an insulating material received in the respective recess.

7. A method for forming an electrostatic chuck device for use in securing a semiconductor wafer substrate, the method comprising:
    providing a power source;
    providing a base plate;
    dividing the base plate into a plurality of electrically separate poles, each of the base plate poles being arranged to hold a negative charge and having an open space defined therein, wherein the base plate is arranged to support the semiconductor wafer substrate;
    coupling each of the separate negative poles of the base plate to the power source;
    providing a plurality of positive poles, each one of the positive poles being positioned in one of the open spaces of a respective negative pole;
    providing in each of the open spaces an insulating material to enable each of the positive poles to hold a positive charge and each of the negative poles to hold a negative charge;
    providing a plurality of fuses;
    coupling one of the fuses to a respective one of the plurality of positive poles, wherein each of the coupled fuses is arranged to deactivate the respective positive pole when the respective positive pole comes into contact with the base plate; and
    coupling the plurality of fuses to the power source, wherein coupled ones of the respective positive poles and negative poles of the base plate are arranged to create separate attraction forces, the attraction forces being arranged to secure the semiconductor wafer substrate.

8. A method as recited in claim 7 further including:
    providing an insulator between each of the positive poles and the respective separate pole of the base plate, wherein the insulator insulates each of the positive poles from each of the respective poles of the base plate.

9. An electrostatic chuck device arranged to hold a semiconductor wafer substrate during processing of the semiconductor wafer substrate, the device comprising:
    a power source;

a plurality of positive poles;

a plurality of negative poles spaced along a workpiece axis, wherein each negative pole selected from the plurality of negative poles is provided with a cavity in which one of the positive poles selected from the plurality of positive poles is received;

electrical insulation provided in each of the cavities to electrically separate the negative poles from the positive poles and enable each of the corresponding respective positive poles in each of the respective cavities and each of the respective negative poles to define a plurality of separate electrostatic chucks extending along the workpiece axis; and a plurality of fuses, each fuse of the plurality of fuses being coupled to an associated negative pole included in the plurality of negative poles, wherein each fuse is further coupled to the power source.

* * * * *